United States Patent
Unnikrishnapillai

(10) Patent No.: US 12,028,083 B2
(45) Date of Patent: Jul. 2, 2024

(54) PHASE CONSISTENT NUMERICALLY CONTROLLED OSCILLATOR

(71) Applicant: Analog Devices International Unlimited Company, Limerick (IE)

(72) Inventor: Krishnan Unni Unnikrishnapillai, Bangalore (IN)

(73) Assignee: Analog Devices International Unlimited Company, Limerick (IE)

( * ) Notice: Subject to any disclaimer, the term of this patent is extended or adjusted under 35 U.S.C. 154(b) by 43 days.

(21) Appl. No.: 18/060,856

(22) Filed: Dec. 1, 2022

(65) Prior Publication Data

US 2024/0187007 A1 Jun. 6, 2024

(51) Int. Cl.
| | | |
|---|---|---|
| *G06F 1/03* | (2006.01) | |
| *H03L 7/099* | (2006.01) | |
| *H03M 1/12* | (2006.01) | |
| *H03M 1/66* | (2006.01) | |

(52) U.S. Cl.
CPC .......... *H03L 7/0994* (2013.01); *G06F 1/0328* (2013.01); *H03L 7/0992* (2013.01); *H03M 1/12* (2013.01); *H03M 1/66* (2013.01)

(58) Field of Classification Search
CPC ... G06F 1/0328; G06F 1/0335; H03L 7/0991; H03L 7/0992; H03L 7/0993; H03L 7/0994
See application file for complete search history.

(56) References Cited

U.S. PATENT DOCUMENTS

| | | | |
|---|---|---|---|
| 4,241,308 A | 12/1980 | Cellier et al. | |
| 5,521,534 A | 5/1996 | Elliott | |
| 5,673,212 A | 9/1997 | Hansen | |
| 6,650,150 B2 | 11/2003 | Farine et al. | |
| 10,742,327 B2 | 8/2020 | Agazzi et al. | |
| 10,879,845 B2 | 12/2020 | Aremallapur et al. | |
| 10,917,077 B1 | 2/2021 | Boumaalif et al. | |
| 2016/0277030 A1* | 9/2016 | Burbano | G06F 1/022 |
| 2018/0066512 A1* | 3/2018 | Li | G06F 1/0328 |

* cited by examiner

*Primary Examiner* — Levi Gannon
(74) *Attorney, Agent, or Firm* — Schwegman Lundberg & Woessner, P.A.

(57) ABSTRACT

A numerically controlled oscillator system for maintaining a consistent phase reference while switching data rates may include a numerically controlled oscillator (NCO) circuit. The NCO circuit may include a phase accumulator, a phase-to-signal mapping circuit, and a first free-running counter. The phase accumulator may receive a new phase value as an input in response to an update signal. The phase-to-signal mapping circuit may map a value from the phase accumulator to a periodic signal. The first free-running counter may continue counting, without being reset, while the numerically controlled oscillator system is switching digital data rates. The first free-running counter may be configured to provide the new phase value to the phase accumulator using a representation of a counter value of the first free-running counter and a frequency tuning word defined by a representation of a frequency of the periodic signal.

20 Claims, 7 Drawing Sheets

PHASE CONSISTENT NUMERICALLY CONTROLLED OSCILLATOR

TECHNOLOGICAL FIELD

The present disclosure relates to electronics, and more particularly, but not by way of limitation, to a numerically controlled oscillator that can be dynamically reconfigured to change data rates in a predictable manner.

BACKGROUND

Modern systems can use numerically controlled oscillators to generate signals for communication or testing, or to analyze received signals. Examples of such modern systems include communication systems, radar systems, and radio frequency circuits such as radio frequency analyzers and radio frequency converters. The frequency of the numerically controlled oscillator may be selected to match a desired received or transmitted signal frequency.

SUMMARY

The numerically controlled oscillator frequency may need to be changed during the operation of the electronic system, such as to match a new desired signal frequency, or to coordinate with upstream or downstream signal processing circuits. The present inventor has recognized, among other things, that the digital data rate of the numerically controlled oscillator may need to be changed to match the data rate of upstream or downstream digital signal processing circuits. The dynamic change of data rates may or may not correspond with a change in numerically controlled oscillator frequency.

Following a dynamic change in data rate, the phase of the new signal may not be aligned with the phase of previous signals. This may cause issues with downstream components or require a time-consuming restart of the system. This document describes, among other things, a numerically controlled oscillator system that can be reconfigurable and predictable, such as by using a free-running counter to maintain a consistent phase reference when switching between various data rates and signal frequencies.

In an example, a numerically controlled oscillator system for maintaining a consistent phase reference while switching data rates may include a numerically controlled oscillator (NCO) circuit. The NCO circuit may include a phase accumulator, a phase-to-signal mapping circuit, and a first free-running counter. The phase accumulator may receive a new phase value as an input in response to an update signal. The phase-to-signal mapping circuit may map a value from the phase accumulator to a periodic signal. The first free-running counter may continue counting, without being reset, while the numerically controlled oscillator system is switching digital data rates. The first free-running counter may be configured to provide the new phase value to the phase accumulator using a representation of a counter value of the first free-running counter and a frequency tuning word defined by a representation of a frequency of the periodic signal.

In an example, a numerically controlled oscillator system may include a first free-running counter, a coarse NCO circuit, and a fine NCO circuit. The fine NCO circuit may have an input coupled to an output of the coarse NCO circuit. When the data rate of the coarse NCO circuit is changed, a clock rate of the fine NCO circuit may be changed to match the new data rate of data output by the coarse NCO for input by the fine NCO. Before starting the fine NCO, a representation of a current phase of a desired fine NCO frequency may be determined using a counter value of the first free-running counter and sent to the phase accumulator of the fine NCO.

In an example, a method for maintaining a consistent phase reference for a digital periodic signal while switching digital data rates may include starting a first free-running counter, where the first free-running counter is not reset during a time period in which the consistent phase reference is to be maintained. The method may also include obtaining, from the first free-running counter, a representation of a current phase value of a desired NCO frequency that is consistent with a phase value at the time of starting the first free-running counter. The method may also include using the representation of the current phase value of the desired NCO frequency to load a starting value into a phase accumulator of an NCO.

DETAILED DESCRIPTION

The present disclosure relates to a numerically controlled oscillator (NCO) that can dynamically change data rates and frequency while maintaining a consistent phase reference.

Figure 1:
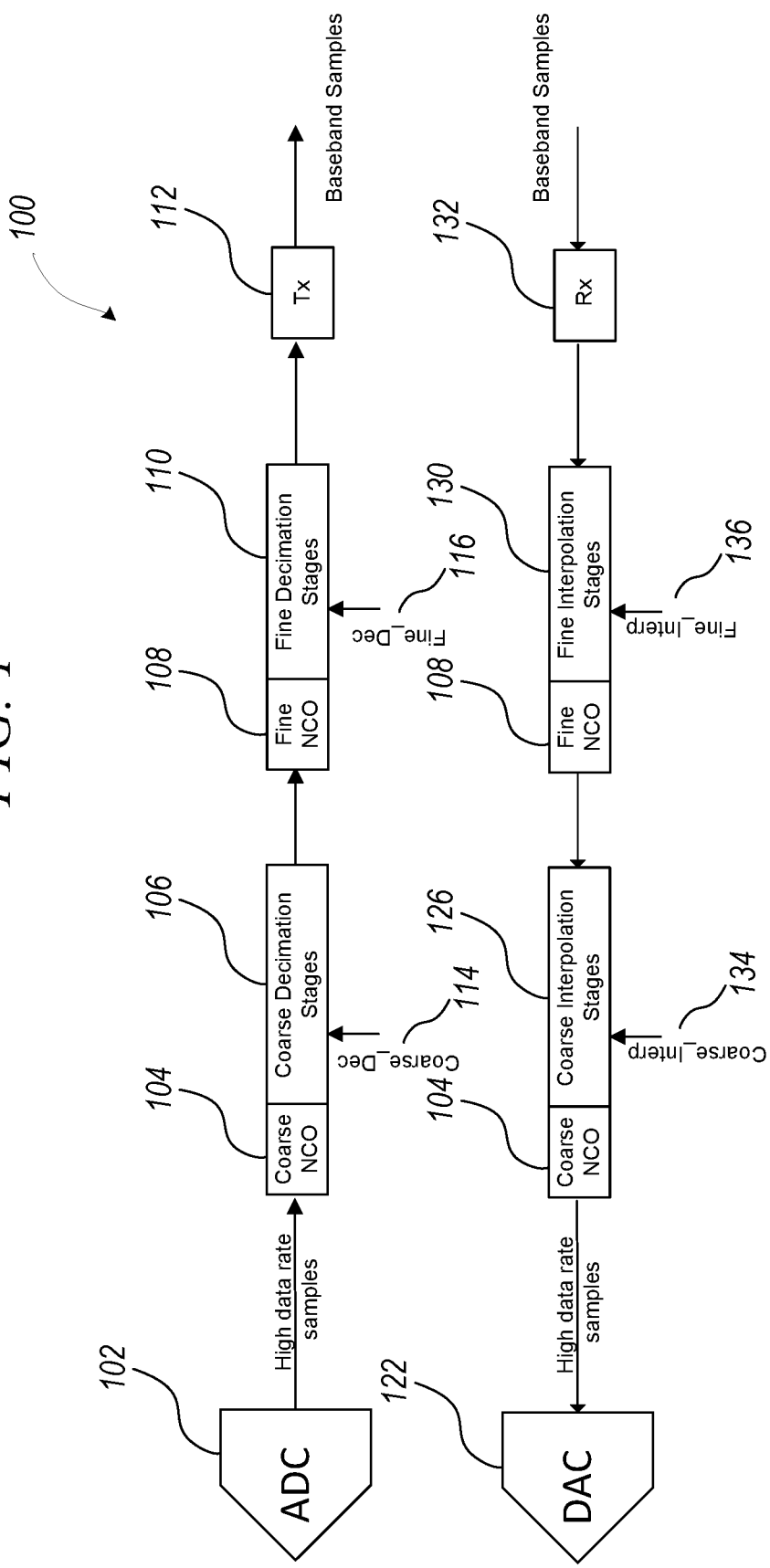
FIG. 1 is a schematic drawing of an example of portions of a radio frequency analyzer circuit.

FIG. 1 is a schematic drawing of an example of portions of a radio frequency analyzer circuit 100. In the example of FIG. 1, the radio frequency analyzer circuit 100 can include an analog-to-digital converter 102, one or more coarse NCOs 104, one or more coarse decimation stages 106, one or more fine NCOs 108, one or more fine decimation stages 110, and a transmit circuit 112. In the example of FIG. 1, the radio frequency analyzer circuit 100 can also include a digital-to-analog converter 122, one or more coarse interpolation stages 126, one or more fine interpolation stages 130, and a receive circuit 132.

The radio frequency analyzer circuit 100 receives analog input data at the analog-to-digital converter 102 and passes the resulting digital data stream from the analog-to-digital converter 102 to a coarse NCO 104 which may process the input signal. The coarse NCO 104 may operate in tandem with a coarse decimation stage 106 to downsample such as by discarding some of the digital samples. The coarse decimation stage 106 may downsample at a coarse decimation rate 114 determined by the input Coarse_Dec. The coarse decimation stage 106 may filter the signal before downsampling such as to prevent aliasing. The input of the fine NCO 108 may be coupled to the output of the coarse NCO circuit and receive data from the coarse decimation stage 106 and may further process the digital data stream. The fine NCO 108 may operate in tandem with a fine decimation stage 110 to downsample such as by discarding some of the digital samples. The fine decimation stage 110 may downsample at a fine decimation rate 116 determined by the input Fine_Dec. The transmit circuit 112 may receive data from the fine decimation stage 110 and transmit this data to another circuit component or to another system.

The radio frequency analyzer circuit 100 may have a data-transmit path that receives data at a receive circuit 132 and generates a signal at a digital-to-analog converter 122. In the example of FIG. 1, the data-transmit circuit passes the digital data stream received at the receive circuit 132 through a fine interpolation stage 130 to upsample the data. The fine interpolation stage 130 may use one or more interpolation techniques to prevent aliasing and may upsample the data at a fine interpolation rate 136 determined by the input Fine Interp. The fine interpolation stage 130 may operate in tandem with a fine NCO 108 to process the digital data stream. The data stream from the fine NCO 108 may pass to a coarse interpolation stage 126 which may upsample the data at a coarse interpolation rate 134 determined by the input Coarse Interp. The coarse interpolation stage 126 may use one or more interpolation techniques to prevent imaging. The coarse interpolation stage 126 may operate in tandem with a coarse NCO 104 to provide further processing of the signal. From the coarse NCO 104, the digital data stream is converted to an analog signal in the digital-to-analog converter 122. The data-transmit circuit may be configured similarly to the data-receive circuit discussed above, or the data-transmit circuit may differ in one or more ways.

In the various NCO stages shown in FIG. 1, it may be desirable for the clock rate of the NCO stage to match the data rate of the digital data stream. For example, if the coarse decimation stage 106 has an output data rate of 1 GHz, it may be desirable for the fine NCO 108 to have a matching clock rate of 1 GHz. When the coarse decimation rate 114 changes, it may change the output data rate of the coarse decimation stage 106, which may make it desirable to change the clock rate of the fine NCO 108. For example, if the decimation rate Coarse_Dec 114 changes from 2 to 4, the data rate leaving the coarse decimation stage 106 may change from 1 GHz to 0.5 GHz. This may make it desirable to change the clock rate of the fine NCO 108 from 1 GHz to 0.5 GHz to match the digital data rate. The frequency of the fine NCO 108 may remain constant throughout the change in data rate and clock rate. For example, the frequency of the fine NCO 108 may be 0.25 GHz when the coarse decimation rate 114 is both 2 and 4.

It may be desirable for the phase of the fine NCO 108 to remain consistent across one or more changes in data rates, changes in clock rates, or both. For example, it may be desirable for the phase of the 0.25 GHz fine NCO signal to be consistent when the coarse decimation rate 114 is 2 and 4. This phase consistency may allow for precision or reliability in signal processing, and it may allow the data path to switch data rates without restarting, which may save time and allow for quicker changes in decimation rates.

It may be desirable for the phase of the fine NCO 108 to remain consistent with a prior configuration of the radio frequency analyzer circuit 100. For example, it may be desirable for the phase of the 0.25 GHz fine NCO signal to be consistent with a previous coarse decimation rate 114 of 2 after switching to one or more intermediate coarse decimation rates 114 before returning to a coarse decimation rate 114 of 2. In an example, an external system may utilize the output of the fine NCO 108 when the coarse decimation rate 114 is 2. Following a change in coarse decimation rate 114 to 4, the external system may continue running. The running external system may utilize data from the fine NCO 108, from another system, or may not process data. Following a change in coarse decimation rate 114 back to 2, the external system may utilize data from the output of the fine NCO 108. Because the phases of the fine NCO 108 signal may be aligned for the previous coarse decimation rate 114 of 2 and the present coarse decimation rate 114 or 2, the external system may be able to process data more accurately or continue running without restarting.

Figure 2:
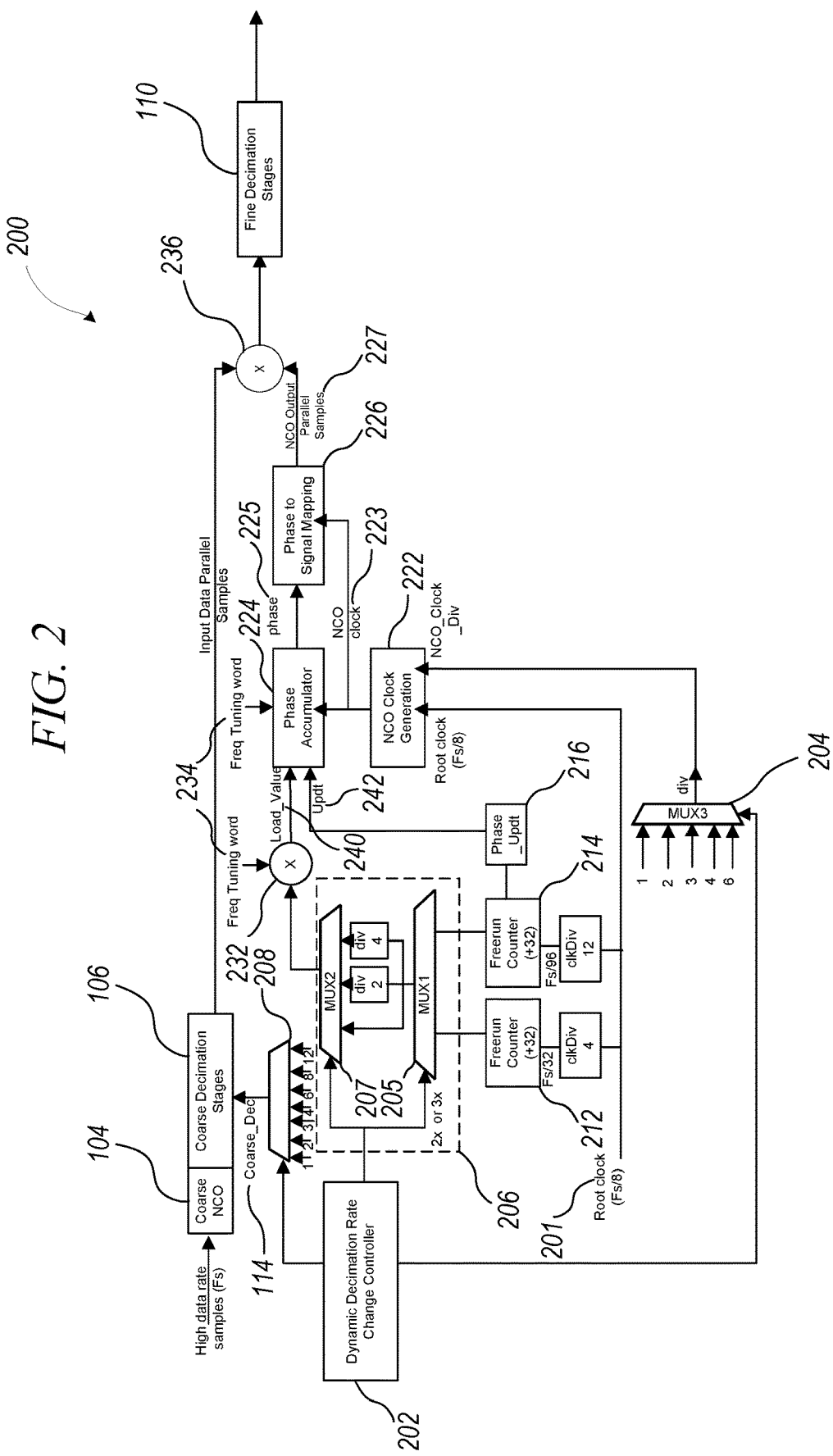
FIG. 2 is a schematic drawing of an example of portions of a numerically controlled oscillator circuit and portions of an example of a system in which the numerically controlled oscillator circuit can be used.

FIG. 2 is a schematic drawing 200 of an example of portions of a numerically controlled oscillator circuit and portions of an example of a system in which the numerically controlled oscillator circuit can be used. In the example of FIG. 2, there is a digital data path that can include a coarse NCO 104, a coarse decimation stage 106, a fine NCO signal processing stage 236, and a fine decimation stage 110. FIG. 2 may include portions of a fine NCO 108, such as which can include a root clock signal input 201, a first free-running counter 212, a second free-running counter 214, a phase update generation circuit 216, an NCO clock generation circuit 222, a counter selection and processing circuit 206, a frequency tuning word 234, a load value calculation circuit 232, a phase accumulator 224, and a phase-to-signal mapping circuit 226. Additionally, FIG. 2 shows a dynamic decimation rate change controller 202, a Coarse_Dec multiplexor 208, and an NCO clock division multiplexor 204.

The digital data path may be similar to the data-receive circuit described in FIG. 1, or it may differ in one or more ways. The dynamic decimation rate change controller 202 is connected to the Coarse_Dec multiplexor 208 to select between various decimations rates of the coarse decimation stage 106. In the example of FIG. 2, the decimation rates include 1, 2, 3, 4, 6, 8, and 12. The dynamic decimation rate change controller 202 is also connected to the NCO clock division multiplexor 204, whose division values can include 1, 2, 3, 4, and 6. The dynamic decimation rate change controller 202 is also connected to the counter selection and processing circuit 206. The counter selection and processing circuit 206 includes a free-running counter selection multiplexor 205. The free-running counter selection multiplexor 205 can be connected to the first free-running counter 212 and the second free-running counter 214 to select therebetween. The counter selection and processing circuit 206 can include a free-running counter division value selection multiplexor 207, whose division values can include 1, 2, and 4.

The fine NCO 108 may operate by incrementing the phase accumulator 224, such as by a value specified by the frequency tuning word 234, such as in response to each NCO clock signal 223 from the NCO clock generation circuit 222. The frequency tuning word 234 may be defined by a representation of a frequency of a periodic signal. The phase value 225 in the phase accumulator 224 may then be converted to a periodic signal output 227 using a phase-to-signal mapping circuit 226. The periodic signal may be a sine, a cosine, a representation of a sine, a representation of a cosine, or any other periodic signal. Additionally, the periodic signal may be a combination of two or more periodic signals.

The phase accumulator 224 may store the current phase of the output signal, such as in degrees, radians, or another unit. The current phase value may continue incrementing without being reset. The phase-to-signal mapping circuit 226 can convert the phase value to the correct value of the periodic signal output. For example, the phase accumulator 224 may reset to 0 when the phase value 225 reaches a specified number.

The phase-to-signal mapping circuit 226 may convert the phase value 225 to the periodic signal output 227, such as using a lookup table, a power series, or any other method of converting a phase value into a periodic output signal. In an example, the periodic signal may be a sine, the phase accumulator 224 may accumulate using the units of degrees, the frequency tuning word 234 may be in units of degrees, and the frequency tuning word 234 may be 45. The initial phase value 225 of the phase accumulator 224 may be 0. After each clock cycle from the NCO clock generation circuit 222, the phase value 225 of the phase accumulator 224 will be incremented by 45 degrees, and the periodic signal output 227 of the phase-to-signal mapping circuit 226 will be updated to the sine value corresponding to the phase value 225. Table 1 below shows an example of the values for the first 12 clock cycles.

TABLE 1

| Clock Cycle | Phase Value | Signal Output |
| --- | --- | --- |
| 1 | 0 | 0 |
| 2 | 45 | $\sqrt{2}/2$ |
| 3 | 90 | 1 |
| 4 | 135 | $\sqrt{2}/2$ |
| 5 | 180 | 0 |
| 6 | 225 | $-\sqrt{2}/2$ |
| 7 | 270 | −1 |
| 8 | 315 | $-\sqrt{2}/2$ |
| 9 | 360 | 0 |
| 10 | 405 | $\sqrt{2}/2$ |
| 11 | 450 | 1 |
| 12 | 495 | $\sqrt{2}/2$ |

The periodic signal output 227 repeats every 360 degrees because 360 degrees represents one full period of the sine signal. In an example, the output from the phase-to-signal mapping circuit 226 may be delayed by one clock cycle so that the phase accumulator 224 has time to calculate the phase value 225.

If the frequency tuning word 234 is doubled, the frequency of the periodic signal output 227 may also double. If the frequency tuning word 234 is halved, the frequency of the 227 may also be halved. In this way, the frequency tuning word can be used to configure the output frequency of the fine NCO based upon a consistent fine NCO clock rate.

When the rate of the NCO clock signal 223 generated by the NCO clock generation circuit 222 changes, the frequency tuning word may need to change to maintain a consistent frequency at the periodic signal output 227. For example, if the frequency of the NCO clock signal 223 doubles, the frequency of the periodic signal output 227 will double if the frequency tuning word 234 remains constant. Therefore, to maintain a constant frequency at the periodic signal output 227, the frequency tuning word 234 may have to be halved when the frequency of the NCO clock signal 223 is doubled.

It may be desirable for the rate of the NCO clock signal 223 to match the rate of the data leaving the coarse decimation stage 106. This may allow for predictable and reliable performance of the digital data path or it may save power by not running the fine NCO faster than necessary. Therefore, when the coarse decimation rate 114 is doubled, resulting in a halving of the data rate leaving the coarse decimation stage 106, it may be desirable to also halve the rate of the NCO clock signal 223. This halving of the rate of the NCO clock signal 223 may correspond with a doubling of the frequency tuning word 234 to maintain a constant frequency of the periodic signal output 227.

While doubling the frequency tuning word 234 may result in the frequency of the new periodic signal output 227 matching the frequency of the previous periodic signal output 227, it may not result in the new periodic signal output 227 having a phase that matches the old periodic signal output 227. Additionally, it may be desirable to change the frequency of the periodic signal output 227 to a new value, and then return to a previous value at some time in the future but maintain a consistent phase reference to the previous periodic signal output 227. In this way, the periodic signal output 227 may be generated as if neither the data rate nor the frequency had changed. In order to provide this consistent phase reference, it may be desirable to configure the current phase value 225 of the phase accumulator 224 to as opposed to resetting the phase value 225 to 0 or maintaining the current value.

One method of determining the correct phase value to load into the phase accumulator 224 to maintain a consistent phase reference may be to load the phase value that would have accumulated since a predetermined reference point in time—Time-0. Selecting a Time-0 reference point may allow for consistent phase references across numerous data rates, clock rates, and frequencies of the periodic signal output 227 following Time-0 and until a new Time-0 reference is selected.

To facilitate this configuration, the phase accumulator 224 may also accept a Load_Value 240 and an Updt signal 242 as inputs. When the Updt signal 242 is sent from the phase update generation circuit 216, the value from the Load_Value 240 input may be loaded into the phase accumulator 224 as the phase value 225. This may have the effect of resetting the phase accumulator 224 if the Load_Value 240 is 0, or configuring the phase accumulator to jump to a predetermined signal phase if the Load_Value 240 is not equal to 0.

To determine an appropriate Load_Value, it may be desirable to multiply the number of cycles of the NCO clock signal 223 at the selected frequency of the NCO clock signal 223 since Time-0 by the desired frequency tuning word 234. This may replicate the phase value 225 that would have existed if the NCO circuit had been configured for the same data rate and the same frequency tuning word 234 at Time-0 and neither the data rate nor the frequency tuning word 234 had been changed since Time-0. In this way, the system may appear to have been running since Time-0, and therefore produce a periodic signal output 227 with a phase reference consistent to the phase reference at Time-0.

The number of clock cycles of the NCO clock signal 223 at the selected clock frequency may be determined by starting a free-running counter at Time-0, and using a representation of the counter value to determine the number of clock cycles. The representation of the free-running counter may be determined using one or more operations that may include one or more of division, multiplication, or other mathematical or numerical operations.

The rate of the free-running counters may be determined by using the least common multiple (LCM) of all of the individual coarse decimation rates 114. The rate of the free-running counters may be determined using the LCM of all of the individual fine NCO clock signal 223 rates. This may allow the free-running counter value to be divided by any of the integer coarse decimation rates 114 and produce an integer output value representing the number of clock cycles since Time-0. In an example, the Updt signal 242 may be generated when a decimation rate or frequency change is called for by the dynamic decimation rate change controller 202 and the second free-running counter 214 has just counted.

The root clock signal input 201 may be connected to the first free-running counter 212, the second free-running counter 214, and the NCO clock generation circuit 222. The root clock signal input 201 may operate at a speed equal to the high data rate sample (Fs) divided by 8. This speed may result in the signal processing data path operating on a number of parallel samples at once. For example, the various circuits in the datapath may operate on 8 samples in parallel per clock cycle. For example, the various circuits in the datapath may operate on 4 samples in parallel per clock cycle.

The Load Value 240 and the Updt signal 242 may be generated by a pair of free-running counters in conjunction with the phase update generation circuit 216 and the counter selection and processing circuit 206. The first free-running counter 212 may count at a rate equal to the root clock divided by 4 due to clock division logic between the root clock signal and the first free-running counter 212. This may result in a counting speed relative to the high data rate samples of Fs/32. The second free-running counter 214 may count at a rate equal to the root clock divided by 12 due to clock division logic between the root clock signal input 201 and the second free-running counter 214. This may result in a counting speed relative to the high data rate samples of Fs/96. The first free-running counter 212 and the second free-running counter 214 may both increment their counter value by 32 each time they count.

The first free-running counter 212 and the second free-running counter 214 may be connected to the counter selection and processing circuit 206. The counter selection and processing circuit 206 may select between the free-running counters and further divide the selected counter value to produce an output based upon the control of the dynamic decimation rate change controller 202. The output from the processing circuit 206 may be multiplied by the word 234 at the load value calculation circuit 232 to determine the Load Value 240.

Figure 3:
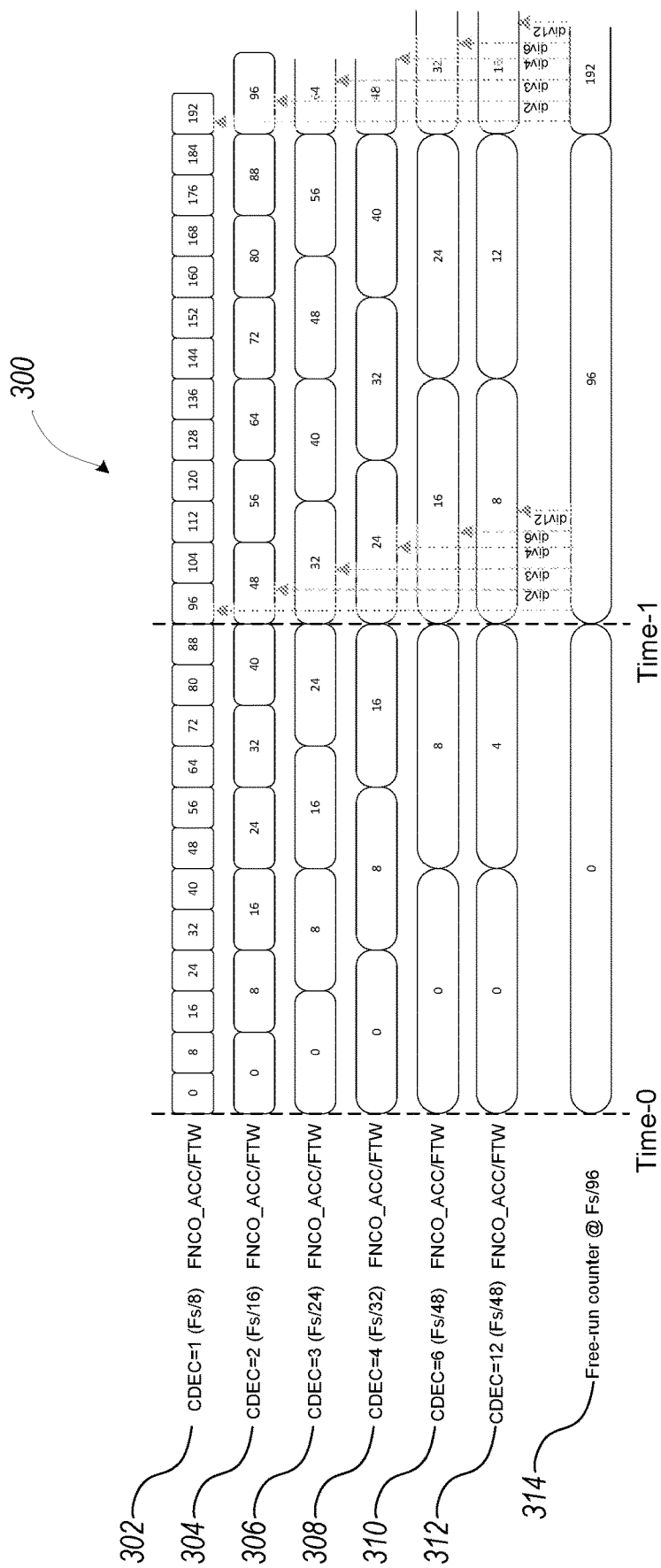
FIG. 3 is a linear graph in time showing an example of operating portions of a numerically controlled oscillator circuit.

FIG. 3 is a linear graph in time 300 showing an example of operating portions of a numerically controlled oscillator circuit. In the example of FIG. 3, there is only a single free-running counter with a counting rate of Fs/96 that increments by 96 each time the free-running counter counts. Table 2 below shows the coarse decimation rates 114, the fine NCO clock rates, and the number of parallel samples at the fine NCO stage.

TABLE 2

| Coarse Decimation Rate | Fine NCO Clock Rate | Fine NCO parallel data samples(NS) |
| --- | --- | --- |
| 1 | Fs/8 | 8 |
| 2 | Fs/16 | 8 |
| 3 | Fs/24 | 8 |
| 4 | Fs/32 | 8 |

TABLE 2-continued

| Coarse Decimation Rate | Fine NCO Clock Rate | Fine NCO parallel data samples(NS) |
| --- | --- | --- |
| 6 | Fs/48 | 8 |
| 12 | Fs/48 | 4 |

FIG. 3 shows the free-running counter value 314, as well as the increment count of the phase accumulator 224 when the coarse decimation (CDEC) equals 1 in row 302, 2 in row 304, 3 in row 306, 4 in row 308, 6 in row 310, and 12 in row 312. Additionally, FIG. 3 shows the rate of the NCO clock signal 223 for each row. In the example of FIG. 3, the phase accumulator 224 may accumulate a phase value of eight times the frequency tuning word 234 at each clock cycle for coarse decimation rates of 1, 2, 3, 4, and 6 to correspond with the number of parallel data samples being 8. The phase accumulator 224 may accumulate a phase value of four times the frequency tuning word 234 at each clock cycle for the coarse decimation rate of 12 to correspond with the number of parallel data samples being 4.

In the example of FIG. 3, the free-running counter value 314 may increment by 96 every 96 data samples, and in this way may keep track of the total number of data samples since Time-0. The root clock signal input 201 may count at a speed equal to data sample rate divided by 8, and the free-running counter may count at a speed equal to the root clock signal input 201 divided by 12. This may result in the free-running counter value 314 incrementing every 96 data samples. In an example, the free-running counter value 314 may increment by 1 every 96 data samples, and then may be multiplied by 96 before being used in further calculations. The number of increments of the phase accumulator 224 is shown in each row, and the necessary division of the free-running counter to obtain the increment value is also shown. For example, for the coarse decimation rate of 1 shown in row 302, the value of the free-running counter may be loaded directly into the increment count value, giving a value of 96 and Time-1. For the coarse decimation rate of 6, the value of the free-running counter may be divided by 6 before being loaded into the increment count value, giving a value of 16 at Time-1. For the coarse decimation rate of 12, the value of the free-running counter may be divided by 12 before being loaded into the increment count value, giving a value of 8 at Time-1.

In the example of FIG. 3, the rate of the NCO clock signal 223 is the same for coarse decimation rates of 6 and 12, but the corresponding number of parallel data samples is halved for the coarse decimation rate of 12, resulting in the frequency tuning word doubling and the increment count being halved.

The example of FIG. 3 may be able to supply the correct increment counts to calculate the proper Load Value 240 for coarse decimation rates of 1, 2, 3, 4, 6, and 12. However, this may result in divide-by-3 logic being used as opposed to just dividing by an exponential power of 2. For example, 1, 2, and 4, may be able to be expressed directly as a power of 2, while 3, 6, and 12 may require multiplying an exponential power of 2 by 3. Table 3 below shows this.

TABLE 3

| Coarse Decimation Rate | Representation in Powers of 2 |
| --- | --- |
| 1 | $2^0$ |
| 2 | $2^1$ |
| 3 | $3 * 2^0$ |

TABLE 3-continued

| Coarse Decimation Rate | Representation in Powers of 2 |
|---|---|
| 4 | $2^2$ |
| 6 | $3 * 2^1$ |
| 12 | $3 * 2^2$ |

Some numbers may be able to be represented as a power of 2.

$$2^n$$

Some other numbers may be able to be represented as an integer multiplied by a power of 2.

$$3*2^n \text{ or generally: } X*2^n$$

If the integer X is itself a power of 2, the representation may be able to be simplified to a power of 2. If the integer X is not a power of 2, the representation may not be able to be simplified. Division by numbers that cannot be simplified to a power of 2 may be slow, hardware intensive, resource intensive, or inaccurate. Division by a power of 2 may be able to be accomplished by a left shift of a register, and may therefore be much more efficient. For these potential reasons, it may be desirable to divide free-running counter values by a power of 2.

Starting one or more additional free-running counters that counts at a different rate, increments by a different value, or both, may allow for less division by values that are not a power of 2. In an example, an additional free-running counter may count at the rate of the original free-running counter, for example Fs/96, but may only increment by an integer division of the original increment, for example 96/3=32. This may result in the additional free-running counter having a pre-configured divide by 3 in its count so that division by powers of 2 can be used to represent division by 3 multiplied by a power of 2. In an example, the additional free-running counter may allow the counting speed and counting rate of the original free-running counter to change. For example, if the original free-running counter is no longer used for divisions of 3 multiplied by a power of 2, it may be able to run 3 times as fast, at a rate of the root clock signal input 201 divided by 4 instead of divided by 12, and increment one-third as much at each count, an increment of 32 rather than 96.

Figure 4:
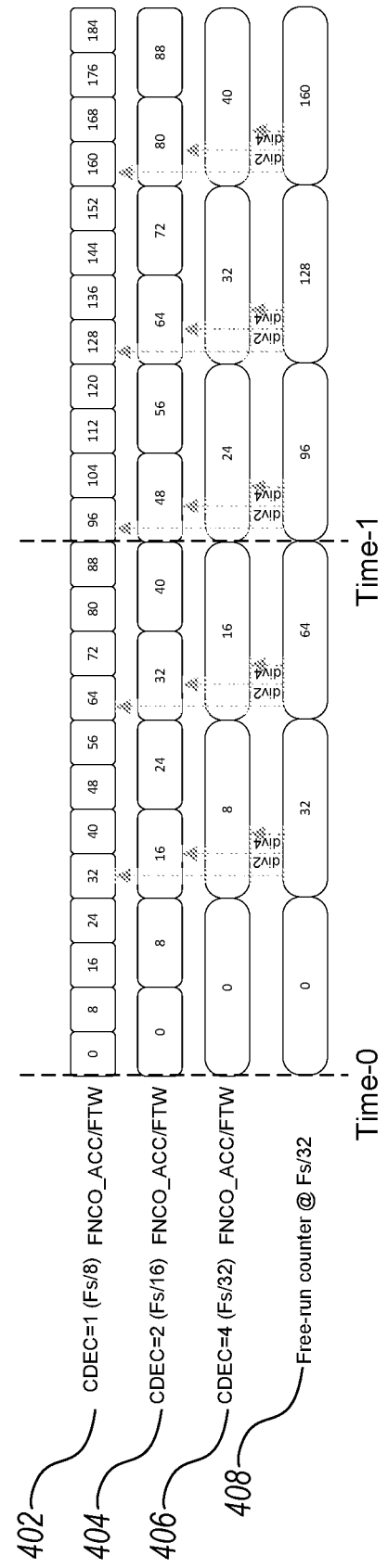
FIG. 4 is a linear graph in time showing an example of operating portions of the numerically controlled oscillator circuit of FIG. 2.

FIG. 4 is a linear graph in time 400 showing an example of operating portions of the numerically controlled oscillator circuit of FIG. 2. In the example of FIG. 4, the first free-running counter 212 counts at a speed that may be equal to the root clock divided by 4. The first free-running counter value 408 is shown, as well as the increment count of the phase accumulator 224 when the coarse decimation rate equals 1 in row 402, 2 in row 404, and 4 in row 406.

The first free-running counter 212 may be used to determine increment counts for decimation values that can be represented as a power of 2, such as 1, 2, and 4.

Figure 5:
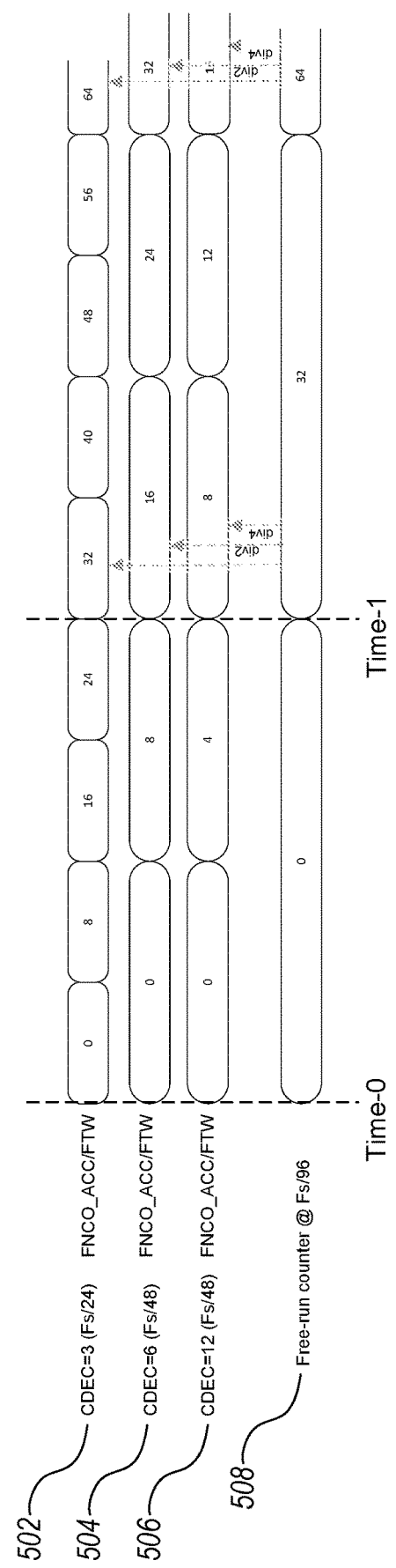
FIG. 5 is a linear graph in time showing an example of operating portions of the numerically controlled oscillator circuit of FIG. 2.

FIG. 5 is a linear graph in time 500 showing an example of operating portions of the numerically controlled oscillator circuit of FIG. 2. In the example of FIG. 5, the second free-running counter 214 counts at a speed that may be equal to the root clock divided by 12. The second free-running counter value 508 is shown, as well as the increment count of the phase accumulator 224 when the coarse decimation rate equals 3 in row 502, 6 in row 504, and 12 in row 506. The second free-running counter 214 may only increment by 32 every 12 root clock cycles, rather than incrementing by 96 every 12 root clock cycles. Because the division logic is less by a factor of 3 for each coarse decimation rate using the second free-running counter 214, a division of the second free-running counter value 508 by a power of 2 may give a result that would have occurred if the counter had incremented by 96 and then been divided by a factor of 3. For example, with a coarse decimation rate of 6 at Time-1, FIG. 3 shows dividing the current counter increment value of 96 by 6 to obtain 16. FIG. 5 shows that the counter has only been incremented by 32, a factor of 3 less than the counter increment of 96 in FIG. 3. FIG. 5 also shows dividing by 2, a factor of 3 less than the division by 6 of FIG. 3. This may result in the same increment count of 16.

Figure 6:
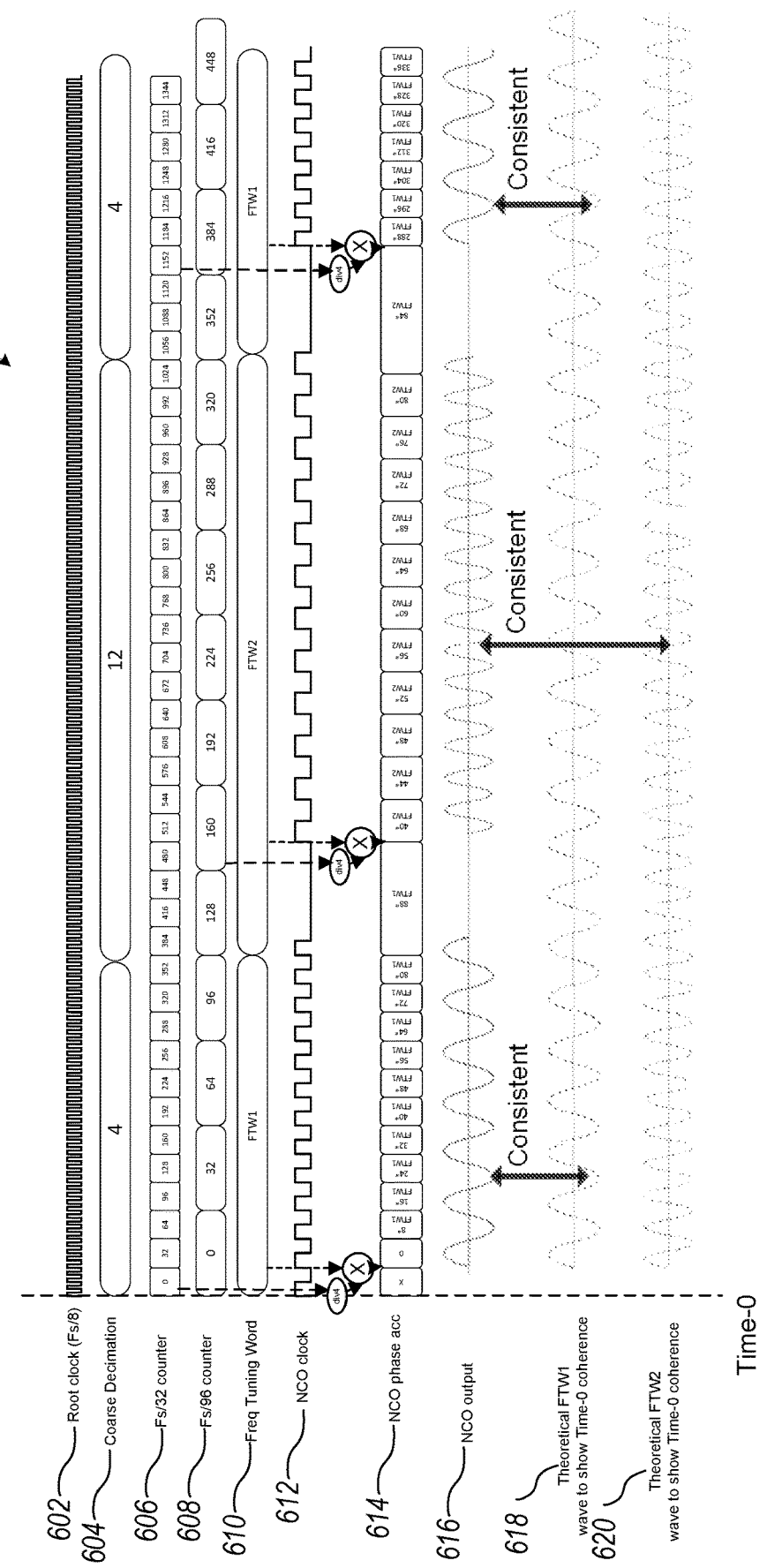
FIG. 6 is a timing diagram showing an example of operating portions of a numerically controlled oscillator circuit shown in FIG. 2.

FIG. 6 is a timing diagram 600 showing an example of operating portions of the numerically controlled oscillator circuit of FIG. 2. The root clock signal input 201 value is shown in row 602. The selected coarse decimation rate is shown in row 604. The value of the first free-running counter 212 is shown in row 606. The value of the second free-running counter 214 is shown in row 608. The selected frequency tuning word 234 is shown in row 610. The NCO clock signal 223 value is shown in row 612. The phase value 225 is shown in row 614. The NCO periodic signal output 227 is shown in row 616. The theoretical frequency tuning word 1 (FTW1) waveform is shown in row 618. The theoretical frequency tuning word 2 (FTW2) waveform is shown in row 620.

In the example of FIG. 6, the initial coarse decimation rate 114 may be 4, and the initial frequency tuning word 234 may be FTW1. At Time-0 both free-running counters begin counting as shown in rows 606 and 608. Also at Time-0, the value of the first free-running counter 212 is divided by 4 and loaded into the phase accumulator 224. This may have the effect of resetting the phase accumulator 224 because the first free-running counter 212 value is 0. The periodic signal output 227 begins mirroring the theoretical FTW1 waveform as shown by rows 616 and 618.

At a later time, the coarse decimation rate 114 may change from 4 to 12. The NCO may wait until the second free-running counter 214 increments and then load the value of the second free-running counter 214 divided by 4 into the phase accumulator 224. This may have the effect of putting a value of 40*FTW2 into the phase value 225 of the phase accumulator 224 which may mimic the value that would have been present if the NCO circuit had started with a coarse decimation rate 114 of 12 and a frequency tuning word 234 of FTW2 at Time-0 without being reconfigured. The periodic signal output 227 may begin mirroring the theoretical FTW2 waveform as shown by rows 616 and 620.

At a later time, the coarse decimation rate 114 may change from 12 back to 4. The NCO may wait until the second free-running counter 214 increments and then load the value of the first free-running counter 212 divided by 4 into the phase accumulator 224. This may have the effect of putting a value of 288*FTW1 into the phase value 225 of the phase accumulator 224 which may mimic the value that would have been present if the NCO circuit had not been reconfigured after starting with a coarse decimation rate 114 of 4 and a frequency tuning word 234 of FTW1. The periodic signal output 227 may begin mirroring the theoretical FTW1 waveform as shown by rows 616 and 618. The periodic signal output 227 may be phase consistent with the periodic signal output for the previous coarse decimation rate 114 of 4.

The NCO clock signal 223 value shown in row 612 may start out at a rate of Fs/32, or one-quarter of the root clock signal input 201 rate, to match the rate of data leaving the coarse decimation stage 106. The phase accumulator 224 may increment by 8*FTW1 after each cycle of the NCO clock signal 223. After the change to a coarse decimation rate 114 of 12, the NCO clock signal 223 value shown in row 612 may run at a rate of Fs/48 or one-sixth of the root clock signal input 201 rate, to match the rate of data leaving the coarse decimation stage 106. The phase accumulator 224 may increment by 4*FTW2 after each cycle of the NCO clock signal 223. After changing back to the coarse decimation rate 114 of 4, the NCO clock signal 223 value shown in row 612 may run at a rate of Fs/32 and the phase accumulator 224 may increment by 8*FTW1 after each cycle of the NCO clock signal 223.

Figure 7:
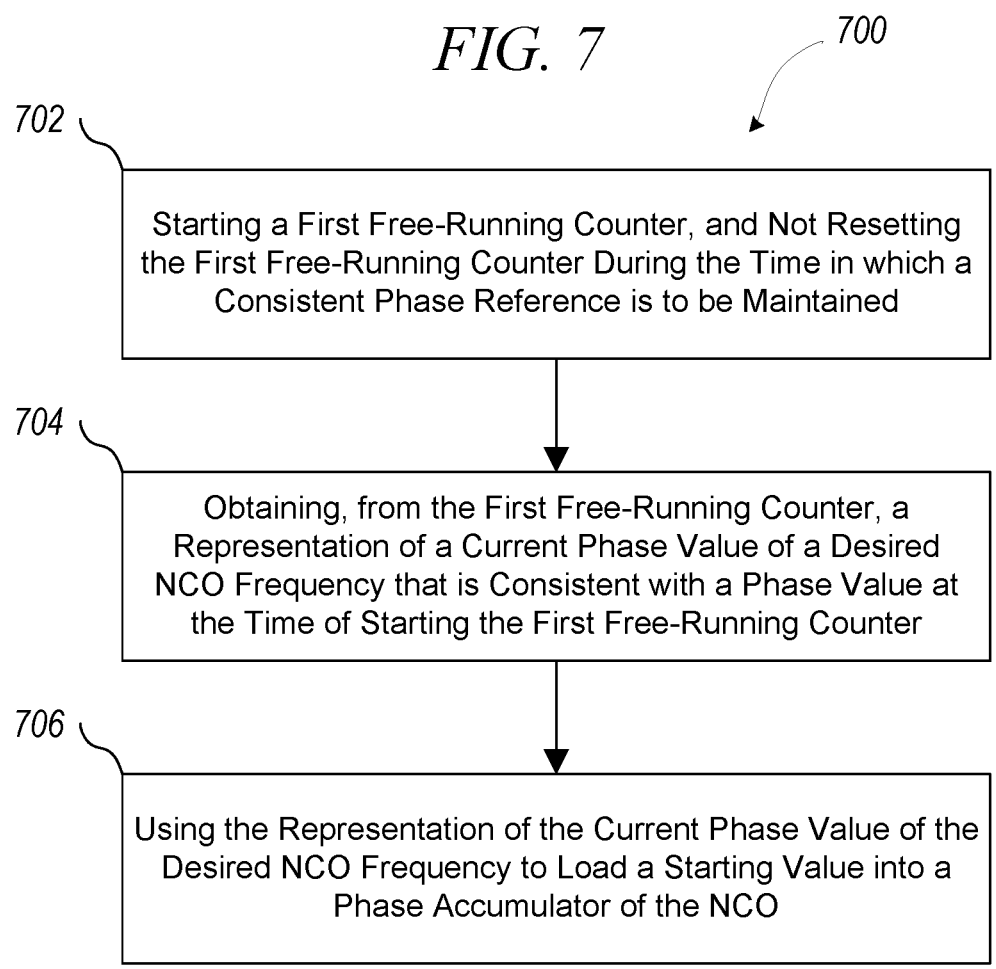
FIG. 7 is a flow chart showing an example of a method for operating portions of a numerically controlled oscillator circuit.

FIG. 7 is a flow chart 700 showing an example of a method for operating portions of a numerically controlled oscillator circuit. The method can include a first step 702—starting a first free-running counter, and not resetting the first free-running counter during the time in which a consistent phase reference is to be maintained. The method can also include a second step 704—obtaining, from the first free-running counter, a representation of a current phase value of a desired NCO frequency that is consistent with a phase value at the time of starting the first free-running counter. The method can also includes a third step 706—using the representation of the current phase value of the desired NCO frequency to load a starting value into a phase accumulator of the NCO. The shown order of steps is not intended to be a limitation on the order the steps are performed in. In an example, 2 or more steps may be performed simultaneously or at least partially concurrently.

The method shown in flow chart 700 may allow a user or program to change the clock rate or frequency of an NCO while maintaining a phase reference consistent with the time at which the first free running counter is started in step 702. The change in clock rate may be desirable to match the data rate of an upstream digital signal processing stage. The method may be implemented on any circuitry capable of performing logic such as a field programmable gate array (FPGA) or application specific integrated circuit (ASIC). The method may be implemented on a dedicated circuit board, or the logic may be part of one or more other circuits. In an example, the method is implemented as part of a radio frequency analyzer circuit.

In step 702, a free-running counter is started, and the counter may continue counting until a consistent phase reference is no longer desired. The value held in the free-running counter may provide a representation of the time that has elapsed since starting the free-running counter, including the number of data samples collected, the number of root clock cycles, or another representation. The free-running counter may be able to count indefinitely, or there may be a limit to the length of time that the counter can run due to counter overrun, such as when the counter value is incremented beyond the storage limit of the counter accumulator variable. In an example, the free-running counter may store the number of data samples that have been taken since the free-running counter was started.

In step 704, a representation of the current phase value of the desired NCO frequency is obtained from the first free-running counter. The first free-running counter may be able to provide a current phase value that is consistent with the phase value at the time of starting the first free-running counter because the counter has not been stopped or reset since it was started. The current phase value may be obtained using multiplication, division, other mathematical functions, or some combination of mathematical functions. In an example, the current phase value is determined by dividing the free-running counter value by a coarse decimation value and then multiplying the result by a frequency tuning word for the desired NCO frequency.

In step 706, the representation of the current phase value is loaded as a starting value into a phase accumulator of the NCO. Loading the current phase value in the NCO may allow the NCO to start running as if the NCO had been running at the desired frequency without stopping since the free-running counter was started. This may allow the produced waveform from the NCO to be phase consistent with the waveform that would have existed if the NCO had been running at the desired frequency without stopping since the free-running counter was started. The representation of the current phase value may be loaded in response to an update signal. The update signal may be generated by the free-running counter, such as when the free-running counter increments, an update signal is generated. In an example, the update signal may be sequenced by the dynamic decimation rate change controller 202.

In an example, a second free-running counter may be started when the first free-running counter is started. The second free-running counter may count and increment at different rates than the first free-running counter. The second free-running counter may allow for a greater range of NCO clock rates while allowing the implementing logic to only use left shift divide by 2 logic.

In example, it is desirable for the total latency of data through a data path to be consistent, in addition to the phase of the NCO periodic signal output 227 being consistent. In order for the total latency of the data through the data path to be consistent, it may be desirable for all of the delays along the data path to match the delays that would have existed if the system was started with the desired configuration at Time-0 and not reconfigured. This result may be obtainable by restarting one or more clocks in response to a synchronization pulse. This may result in all clocks operating as if they had not been reset since Time-0 provided that the synchronization pulse comes at the correct time. The synchronization pulse may be generated at the same time as the Updt signal 242 which may be generated after the LCM of the various individual decimation rates. the LCM of the various individual clock division rates. or the LCM of the various individual decimation rates and the various individual clock division rates. By configuring all clocks and NCOs to operate as if they had not been reset since Time-0, the resulting NCO signals and the resulting datapath latency may be identical to a theoretical system started at Time-0 and not reconfigured.

Many data sample rates Fs, coarse decimation rates 114, and frequency tuning words 234 are possible, and the present techniques, systems, and methods may apply, at least in part, to the possibilities not specifically mentioned in this disclosure. Furthermore, many free-running counter rates are possible, as are versions with more than two free-running counters. Some portions of the schematic circuitry shown, such as the phase update generation circuit 216, may be eliminated in some examples, or their function may be performed in other ways such as by other hardware.

What is claimed is:

1. A numerically controlled oscillator system for maintaining a consistent phase reference while switching digital data rates, the numerically controlled oscillator system comprising:
an NCO circuit, wherein the NCO circuit comprises:
a phase accumulator that receives a new phase value as an input in response to an update signal; and a phase-to-signal mapping circuit that maps a value from the phase accumulator to a periodic signal; and a first free-running counter that continues counting, without being reset, while the numerically controlled oscillator system is switching digital data rates, wherein the first free-running counter is configured to provide the new phase value to the phase accumulator using a representation of a counter value of the first free-running counter and a frequency tuning word defined by a representation of a frequency of the periodic signal.

2. The numerically controlled oscillator system of claim 1, wherein the representation of the counter value of the first free-running counter is based upon an integer division of the counter value.

3. The numerically controlled oscillator system of claim 2, wherein the representation of the counter value of the first free-running counter and the frequency tuning word are multiplied to determine the new phase value.

4. The numerically controlled oscillator system of claim 2, wherein the integer division is by an exponential power of the number two.

5. The numerically controlled oscillator system of claim 2, further comprising:

a second free-running counter that continues counting, without being reset, while switching digital data rates, wherein a speed of the second free-running counter is selected so that a new phase value can be determined by dividing one of the first or the second free-running counter values by an exponential power of the number two, wherein the first counter runs at a speed of a first constant multiplied by a power of the number two and the second counter runs at a speed of a second constant multiplied by a power of the number two, wherein the first and second constants are different integer values.

6. The numerically controlled oscillator system of claim 5, further comprising:

a multiplexor to select between a counter value of the first and second free-running counters in determining the new phase value.

7. A numerically controlled oscillator system comprising:

a first free-running counter;
a coarse NCO circuit; and
a fine NCO circuit, having an input coupled to an output of the coarse NCO circuit, and wherein when a data rate of the coarse NCO circuit is changed, a clock rate of the fine NCO circuit is changed to match a new data rate of data output by the coarse NCO for input by the fine NCO, and wherein, before starting the fine NCO, a representation of a current phase of a desired fine NCO frequency is determined using a counter value of the first free-running counter and sent to a phase accumulator of the fine NCO.

8. The numerically controlled oscillator system of claim 7 further comprising:

a controller, wherein the controller is configured to control the data rate of the coarse NCO, the clock rate of the fine NCO, and the representation of the current phase of the desired fine NCO frequency.

9. The numerically controlled oscillator system of claim 8 further comprising:

a multiplexor, wherein the multiplexor is connected to multiple divided values of the counter value of the first free-running counter and used to select therebetween.

10. The numerically controlled oscillator system of claim 7 further comprising:

a second free-running counter, wherein the second free-running counter runs at a different speed than the first free-running counter, wherein the speed of the second free-running counter is such that a division value for the new data rate can be obtained using divide-by-two logic.

11. The numerically controlled oscillator system of claim 7, wherein a speed of the first free-running counter is selected using a least common multiple of individual fine NCO clock rates.

12. A method for maintaining a consistent phase reference for a digital periodic signal while switching digital data rates, the method comprising:

starting a first free-running counter, wherein the first free-running counter is not reset during a time period in which the consistent phase reference is to be maintained;

obtaining, from the first free-running counter, a representation of a current phase value of a desired NCO frequency that is consistent with a phase value at the time of starting the first free-running counter; and using the representation of the current phase value of the desired NCO frequency to load a starting value into a phase accumulator of an NCO.

13. The method of claim 12 wherein the representation of the current phase value of the desired NCO frequency is loaded in response to an update signal from the first free-running counter.

14. The method of claim 13 wherein the update signal from the first free-running counter is sent at a time when the first free-running counter is incremented.

15. The method of claim 14 wherein a speed of the first free-running counter is selected using a least common multiple of individual NCO data rates.

16. The method of claim 13 wherein the first free-running counter, the NCO, and the update signal are controlled by a controller circuit, wherein the controller circuit performs operations on the first free-running counter value to determine the representation of the current phase value of the desired NCO frequency, and, wherein, the controller sequences the update signal.

17. The method of claim 13 wherein the update signal is also used to restart one or more clock circuits to maintain a consistent data latency along a data path.

18. The method of claim 12, wherein a second free-running counter is started and not reset during a time period in which the consistent phase reference is to be maintained, and wherein a speed of the second free running-counter is different than a speed of the first free-running counter, and wherein the speeds of the first and second free-running counters are selected so that the respective counter values are only divided by an exponential power of the number two to determine the representation of the current phase value.

19. The method of claim 12 wherein the first free-running counter, the NCO, and the phase accumulator are configured to be capable of switching to a new NCO frequency while maintaining the current digital data rate by obtaining, from the free-running counter, a representation of the current phase value of a desired new NCO frequency that is consistent with a reference phase value at the time of starting the free-running counter; and using the representation of the current phase value of the desired new NCO frequency, a starting value is loaded into the NCO phase accumulator.

20. The method of claim 12, wherein a change in digital data rates is due to a change in a data rate of an upstream digital signal processing stage.

\* \* \* \* \*